United States Patent
Kao

(10) Patent No.: US 7,531,903 B2
(45) Date of Patent: May 12, 2009

(54) INTERCONNECTION STRUCTURE USED IN A PAD REGION OF A SEMICONDUCTOR SUBSTRATE

(75) Inventor: Ching-Hung Kao, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 10 days.

(21) Appl. No.: 11/218,456

(22) Filed: Sep. 2, 2005

(65) Prior Publication Data
US 2007/0052092 A1   Mar. 8, 2007

(51) Int. Cl.
*H01L 23/48* (2006.01)
*H01L 23/52* (2006.01)
*H01L 29/40* (2006.01)

(52) U.S. Cl. ...................... 257/758; 257/773
(58) Field of Classification Search .......... 257/758, 257/734, 773, 786
See application file for complete search history.

(56) References Cited

U.S. PATENT DOCUMENTS

| | | | | |
|---|---|---|---|---|
| 5,683,918 A | * | 11/1997 | Smith et al. | 438/151 |
| 6,347,026 B1 | * | 2/2002 | Sung et al. | 361/56 |
| 6,372,409 B1 | | 4/2002 | Yu | 430/313 |
| 6,717,270 B1 | * | 4/2004 | Downey et al. | 257/758 |
| 2003/0173674 A1 | | 9/2003 | Nakamura | 257/758 |

* cited by examiner

*Primary Examiner*—Zandra Smith
*Assistant Examiner*—Candice Y Chan
(74) *Attorney, Agent, or Firm*—J.C. Patents

(57) ABSTRACT

An interconnection structure for a pad region of the substrate is provided. A semiconductor circuit and a pad are disposed on the substrate of the pad region. The interconnection structure includes a first and a second dielectric layers, via plugs and contact plugs. The patterned conductive layer includes an auxiliary layer having a plurality of gaps and a plurality of first wire lines disposed between the auxiliary layers passes through the gaps and exits from the pad region. The first dielectric layer is disposed between the patterned conductive layer and the pad. The via plugs are disposed in the first dielectric layer for connecting the auxiliary layer and the pad. The second dielectric layer is disposed between the substrate and the patterned conductive layer. The contact plugs are disposed in the second dielectric layer for electrically connecting the semiconductor circuit and the first wire lines.

22 Claims, 6 Drawing Sheets

INTERCONNECTION STRUCTURE USED IN A PAD REGION OF A SEMICONDUCTOR SUBSTRATE

BACKGROUND OF THE INVENTION

1. Field of the Invention

The present invention relates to a semiconductor structure, and more particularly, to an interconnection structure.

2. Description of the Related Art

After the semiconductor fabricating process has developed into the deep micron field, some originally insignificant issues have become obvious problems due to the reduced size. In order to save space for further reducing the chip size, the electrostatic discharge circuit is commonly disposed below the pad.

During a wire bonding process using a thermocompression method, since too much pressure is applied on the pad, the dielectric layer sometimes cracks or even the pad would come off, leading to poor yield and low reliability of the package production. The cause of such problem is insufficient adherence between the dielectric layer and the metal layer and the stress from wire bonding process applied on the dielectric layer.

In order to prevent the semiconductor element below the pad from such impact and to ensure the successful bonding, it is quite often that the pad uses two metal layers, so the rest of the lower metal layers can be used for circuit wiring. For the fabricating process with fewer metal layers, the number of the metal layers used for circuit wiring is insufficient.

SUMMARY OF THE INVENTION

Therefore, one object of the present invention is to provide an interconnection structure, in which all of the metal layer below the pad can be used as the interconnection.

Another object of the present invention is to provide an interconnection structure, to prevent the semiconductor circuit below the pad from any impacted during the bonding process and ensure successful bonding.

The present invention provides an interconnection structure in the pad region of the substrate. A semiconductor circuit and a pad corresponding to the pad region are disposed on the pad region of the substrate. The interconnection structure comprises a patterned conductive layer, a first dielectric layer, a plurality of via plugs, a second dielectric layer, and a plurality of contact plugs. The patterned conductive layer comprises an auxiliary layer and a plurality of first wire lines. The auxiliary layer has a plurality of gaps, and the first wire lines disposed between the auxiliary layers passes through the gaps and exits from the pad region. The first dielectric layer disposed between the patterned conductive layer and the pad covers the patterned conductive layer. In addition, the via plugs disposed in the first dielectric layer are used to connect each of the auxiliary layers and to connect the auxiliary layers and the pad. The second dielectric layer disposed between the substrate and the bottom patterned conductive layer covers the semiconductor circuit. Furthermore, the contact plugs disposed in the second dielectric layer is used to electrically connect the semiconductor circuit and the first wire lines.

In the interconnection structure according to an embodiment of the present invention, the auxiliary layer mentioned above is a ring conductive layer, for example, disposed at the periphery of the corresponding pad region.

In the interconnection structure according to the embodiment of the present invention, the auxiliary layer mentioned above further comprises a plurality of block conductive layers disposed in the inner side of the ring conductive layer.

In the interconnection structure according to the embodiment of the present invention, the auxiliary layer mentioned above can be a layered conductive layer, and the first wire lines is disposed between the layered conductive layers.

In the interconnection structure according to the embodiment of the present invention, the auxiliary layer and the first wire lines mentioned above are made of a material such as metal.

In the interconnection structure according to the embodiment of the present invention, the auxiliary layer and the first wire lines mentioned above are made of a material such as Al or Cu.

In the interconnection structure according to the embodiment of the present invention, the pad mentioned above is made of a material such as metal.

In the interconnection structure according to the embodiment of the present invention, the contact plugs and the via plugs mentioned above are made of a material such as metal.

In the interconnection structure according to the embodiment of the present invention, the first dielectric layer and the second dielectric layer mentioned above are made of a material such as silicon oxide.

In the interconnection structure according to the embodiment of the present invention, the semiconductor element mentioned above is for example an electrostatic discharge (ESD) protection circuit.

The interconnection structure according to the embodiment of the present invention further comprises a plurality of second wire lines disposed below the patterned conductive layer.

The present invention further provides an interconnection structure used in the pad region of the substrate. A semiconductor circuit and a pad corresponding to the pad region are disposed on the substrate of the pad region. The interconnection structure comprises a plurality of patterned conductive layers, a plurality of first dielectric layers, a plurality of via plugs, a second dielectric layer, and a plurality of contact plugs. Each of the patterned conductive layers comprises an auxiliary layer and a plurality of first wire lines. The auxiliary layer has a plurality of gaps, and the wire lines disposed between the auxiliary layers passes through the gaps and exits from the pad region. The first dielectric layers disposed between the patterned conductive layers and between the top patterned conductive layer and the pad cover the patterned conductive layer. In addition, the via plugs disposed in the first dielectric layer is used to connect the pad and the auxiliary layer of the top patterned conductive layer. The second dielectric layer disposed between the substrate and the bottom patterned conductive layer covers the semiconductor circuit. Furthermore, the contact plugs disposed in the second dielectric layer is used to electrically couple the semiconductor circuit and the first wire lines of the bottom patterned conductive layer.

In the present invention, since the metal via plugs are used to connect the pad and the auxiliary layer and to connect each of the auxiliary layers for increasing the adherence between layers, the problem of the structure damage due to insufficient adherence between each layer and the dielectric layer can be effectively avoided. In addition, the patterned conductive layer of the present invention has a plurality of gaps for circuit wiring, and the wire lines can be pulled to the outside of the pad region for electrical connection to other semiconductor element.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF EMBODIMENTS

Figure 1:
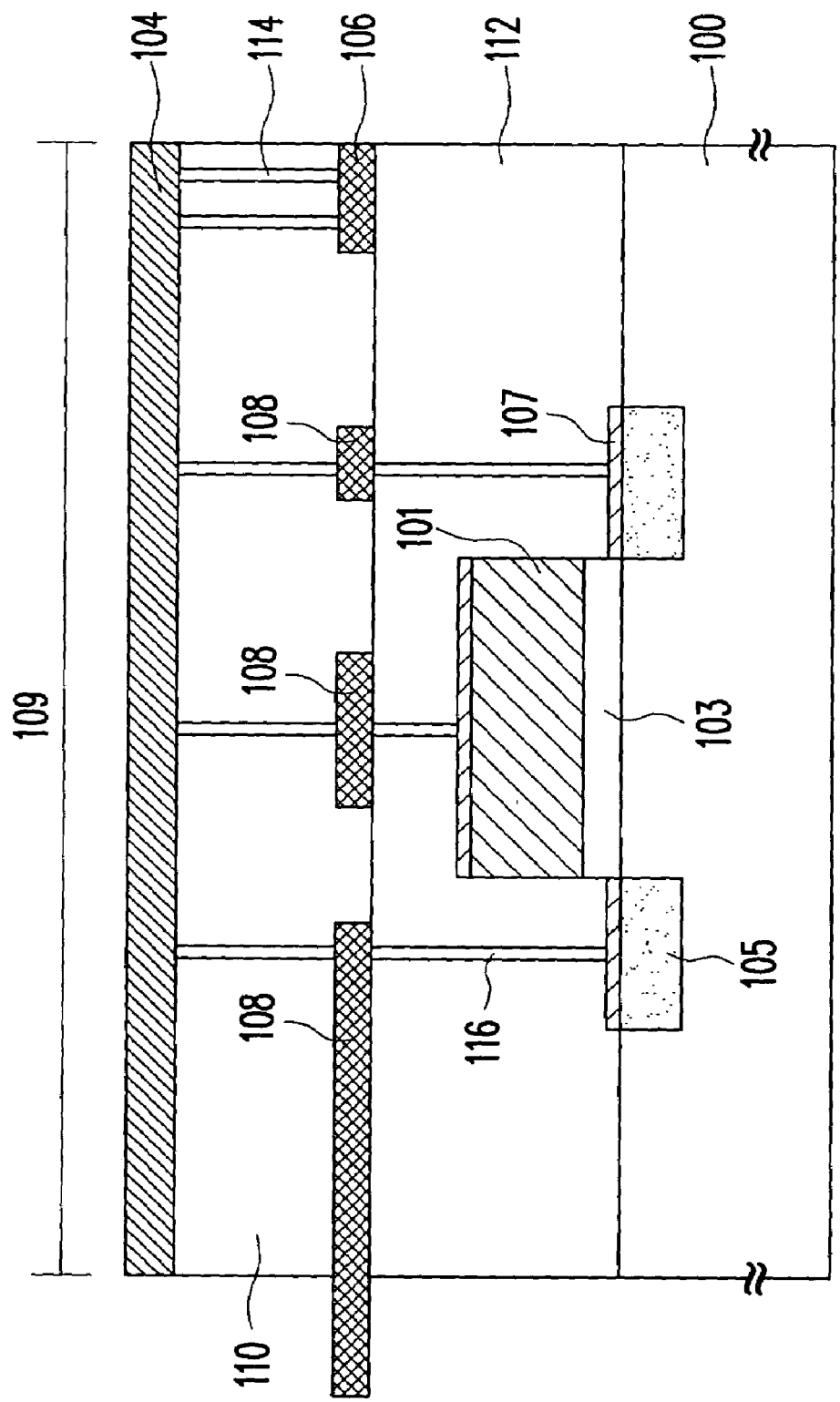
FIG. 1 schematically shows a cross-sectional view of an interconnection structure according to an embodiment of the present invention.
Figure 2A:
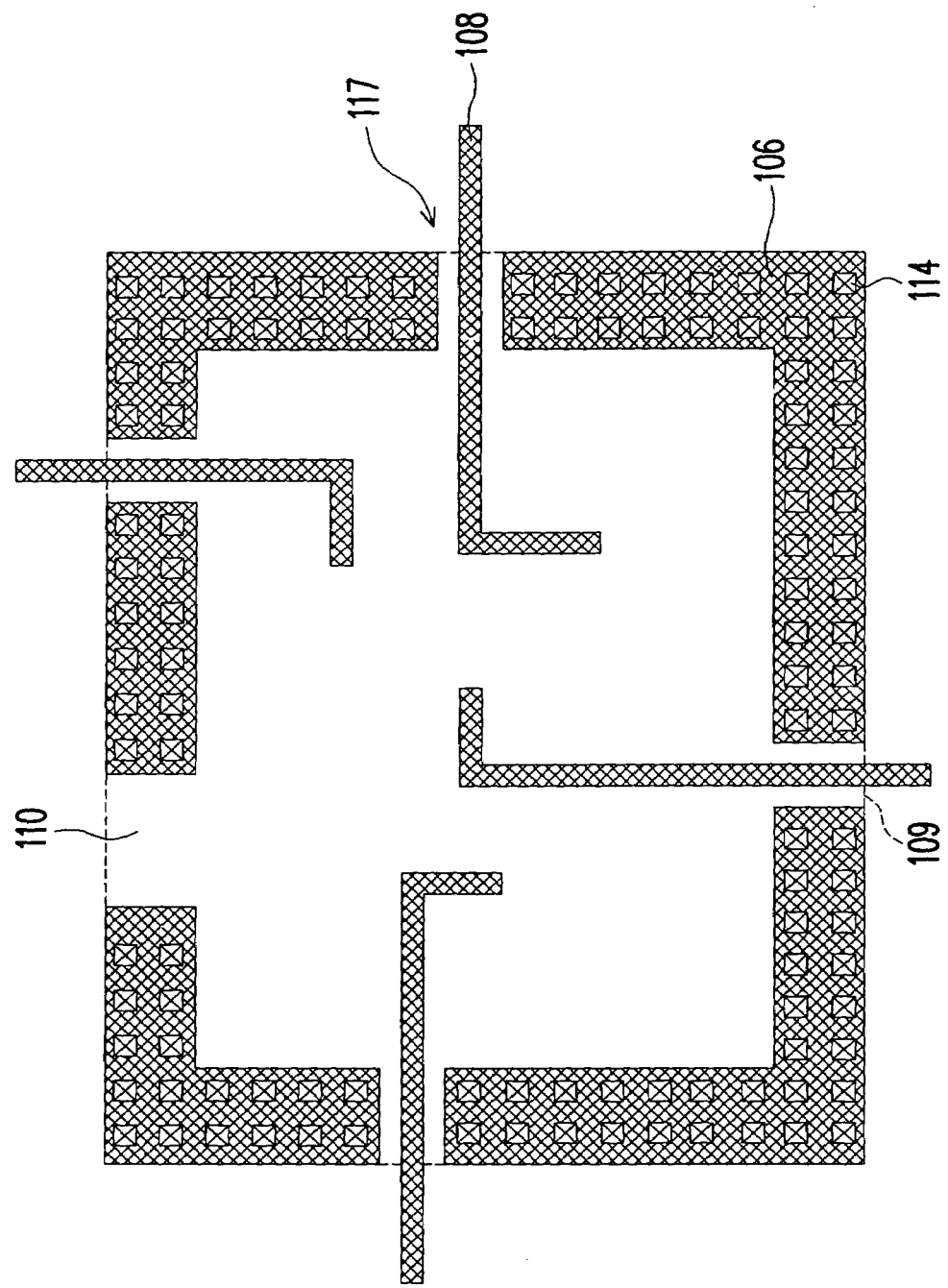
FIG. 2A schematically shows a top view of a patterned conductive layer in an interconnection structure according to an embodiment of the present invention.

FIG. 1 schematically shows a cross-sectional view of an interconnection structure according to an embodiment of the present invention. FIG. 2A schematically shows a top view of an auxiliary layer in an interconnection structure according to an embodiment of the present invention. Referring to FIG. 1 and FIG. 2A, the interconnection structure of the present invention is used in a pad region 109 on a substrate 100, and a semiconductor circuit and a pad 104 corresponding to the pad region 109 are disposed on the pad region 109 of the substrate 100. The pad 104 is made of a material such as metal, and the semiconductor circuit is for example an electrostatic discharge (ESD) protection circuit. In addition, the ESD protection circuit, for example, comprises a gate 101, a gate oxide layer 103, a source/drain region 105, and a salicide layer 107 for reducing the resistance of the source/drain region 105.

In the present embodiment, the interconnection structure comprises a patterned conductive layer, a via plug 114, a contact plug 116, and two dielectric layers 110 and 112. The dielectric layer 112 disposed on the substrate 100 covers the semiconductor circuit. The dielectric layer 112 is made of a material such as silicon oxide. The patterned conductive layer disposed above the dielectric layer 112 comprises an auxiliary layer 106 and a wire lines 108. In addition, the contact plug 116 is disposed in the dielectric layer 112. The contact plug 116 made of a material such as metal electrically connects the semiconductor circuit and the wire lines 108. Moreover, the auxiliary layer 106 is for example a ring conductive layer surrounding the periphery of the pad region 109. The auxiliary layer 106 has a plurality of gaps 117, such that the wire lines 108 disposed in the inner side of the ring conductive layer and passing through the gaps 117 can be pulled outside of the pad region 109. Accordingly, the semiconductor circuit disposed below the pad 104 is electrically connected to any other semiconductor element outside of the pad region 109 via the contact plug 116 and the wire lines 108.

Note that the displacement of the wire lines 108 is not limited to FIG. 2A. In addition, the wire lines 108 and the auxiliary layer 106 are made of a material such as Al or Cu. Moreover, in general, the width of the gap 117 is set wide enough for the wire to pass through the gaps without causing short circuit. In one embodiment, the width of the gap 117 is for example 1.5 times of the width of the wire lines 108.

Referring to FIG. 1 and FIG. 2A, the dielectric layer 110 disposed between the patterned conductive layer and the pad 104 covers the auxiliary layer 106 and the wire lines 108 for separating the auxiliary layer 106 from the wirelines 108, so as to avoid the short circuit due to contact. The dielectric layer 110 is made of a material such as silicon oxide. In addition, the via plug 114 is disposed in the dielectric layer 110 and individually distributed on the entire auxiliary layer 106. The via plug 114 is made of a material such as metal, thus it is also known as a metal via (MVIA) plug. The main function of the via plug 114 is to increase the adherence of the pad 104 and the entire chip, to prevent the situation that, after the wire bonding process, the auxiliary layer 106 and the pad 104 with only the dielectric layer 110 therebetween is pulled apart due to insufficient adherence.

Additionally, the auxiliary layer 106 in the interconnection structure of the present invention may be either a ring conductive layer surrounding the periphery of the pad region 109 mentioned above or a conductive layer with any desired pattern.

Figure 2B:
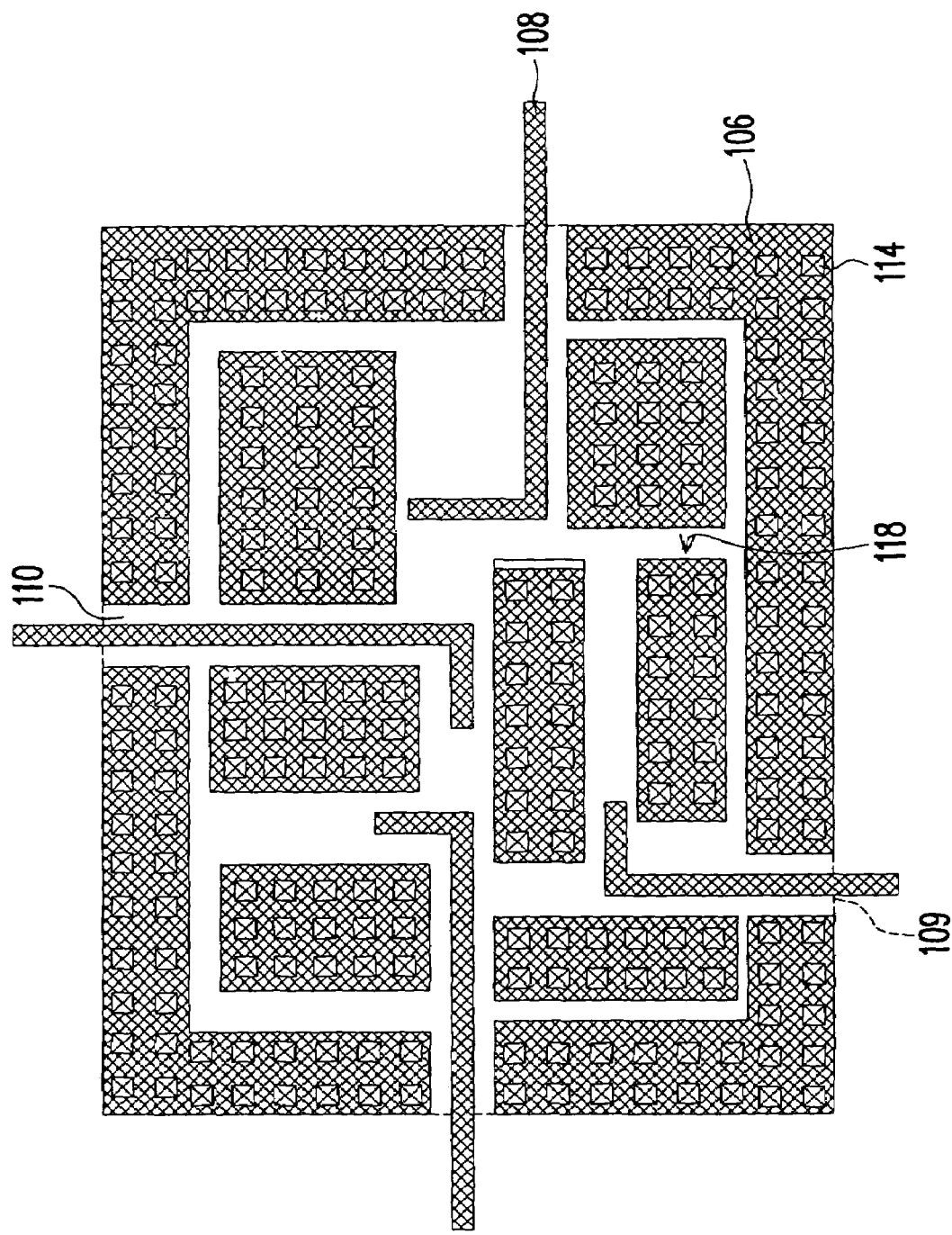
FIG. 2B schematically shows a top view of a patterned conductive layer in an interconnection structure according to another embodiment of the present invention.

FIG. 2B schematically shows a top view of a patterned conductive layer in an interconnection structure according to another embodiment of the present invention. Referring to FIG. 2B, in the present embodiment, the auxiliary layer 106 for example comprises a ring conductive layer surrounding the periphery of the pad region 109 and a plurality of block conductive layers 118. The block conductive layers 118 are disposed in the inner side of the ring conductive layer and the area outside of the wire lines 108. Similarly, a plurality of via plugs 114 are disposed on the entire block conductive layers 118 for increasing the adherence of the pad 104 and the entire chip. Furthermore, the shape and the displacement of the block conductive layers 118 are not limited to FIG. 2A.

Figure 2C:
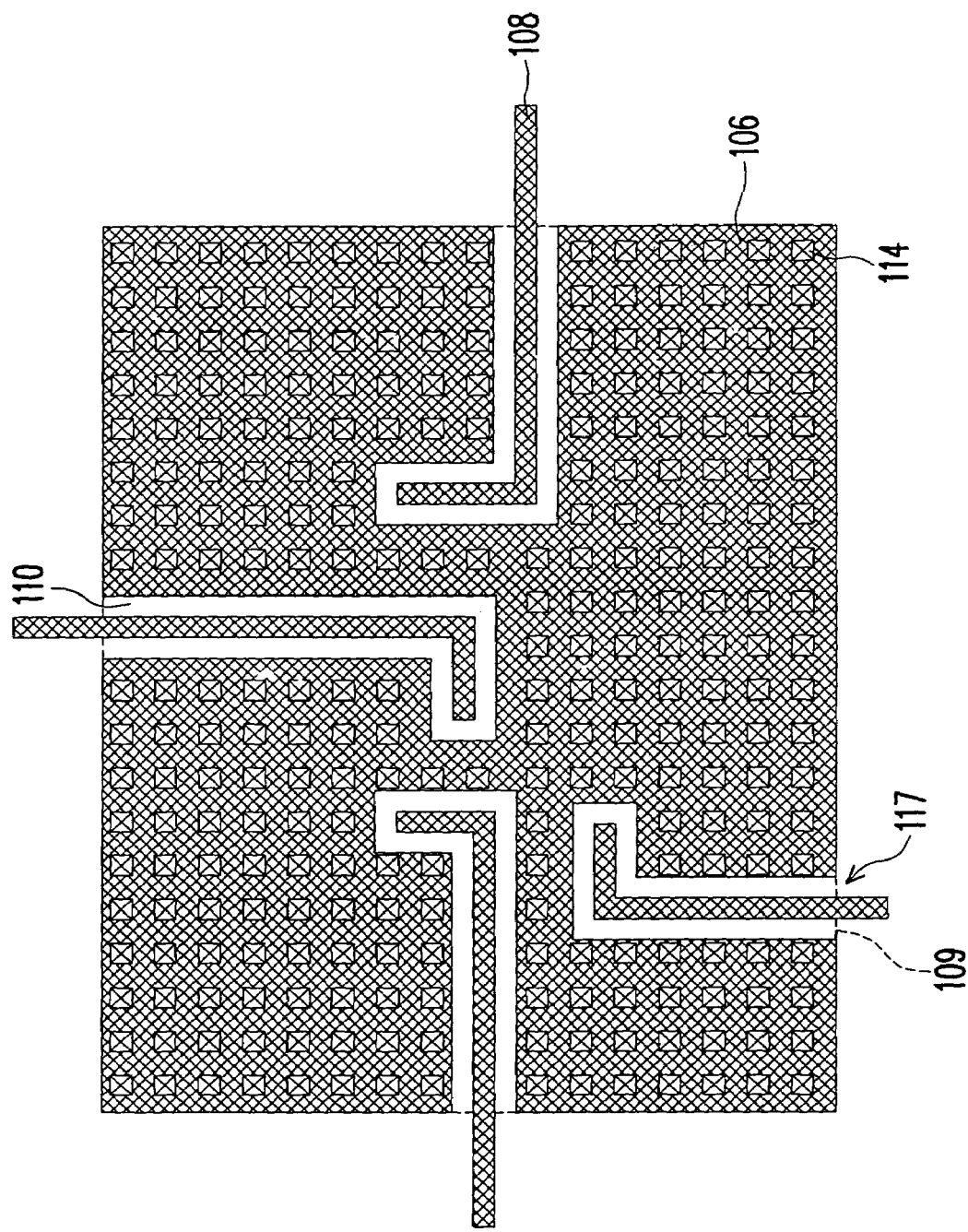
FIG. 2C schematically shows a top view of a patterned conductive layer in an interconnection structure according to yet another embodiment of the present invention.

FIG. 2C schematically shows a top view of a patterned conductive layer in an interconnection structure according to yet another embodiment of the present invention. Referring to FIG. 2C, in the present embodiment, the auxiliary layer 106 is for example a layered conductive layer, and the wire lines 108 is disposed in the layered conductive layer. In other words, the areas that the wire lines 108 does not pass through are conductive layers. Similarly, the via plugs 114 are disposed on the layered conductive layer for connecting the pad 104, so as to increase the adherence of the pad 104 and the entire chip.

Of course, other than the three patterns mentioned above, the auxiliary layer 106 can be any desired pattern based on the physical requirement, and the detail description is omitted herein.

Figure 3:
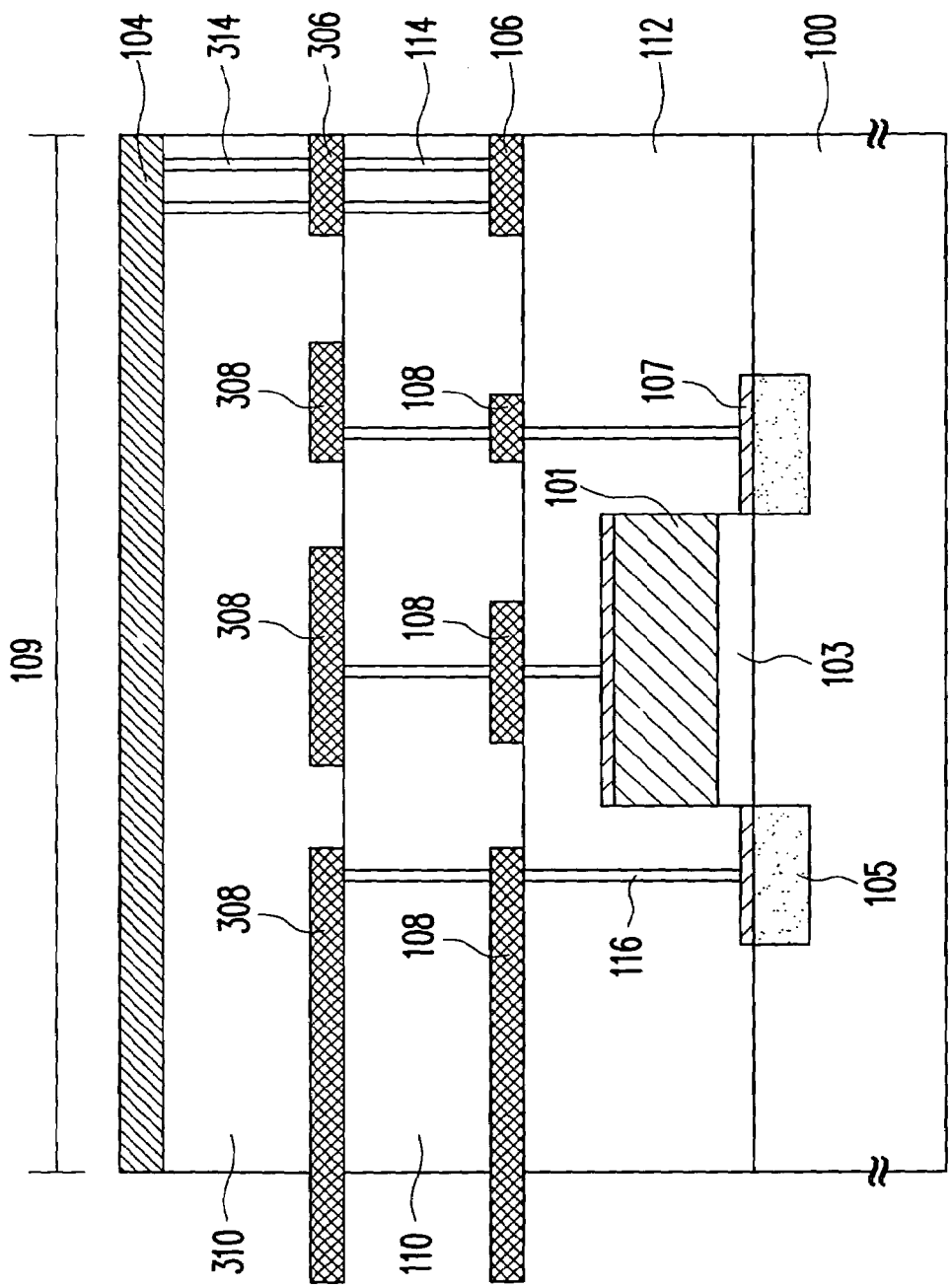
FIG. 3 schematically shows a cross-sectional view of an interconnection structure according to another embodiment of the present invention.

Noted that in another embodiment, the interconnection structure of the present invention may be a structure of multiple patterned conductive layers. FIG. 3 schematically shows a cross-sectional view of an interconnection structure according to another embodiment of the present invention. Such structure comprises two patterned conductive layers, and these two patterned conductive layers comprise an auxiliary layer 306 and a wire lines 308 disposed on the dielectric layer 110, respectively. In such structure, the via plug 114 is used to connect the auxiliary layers 106 and 306, and the via plug 314 is used to connect the auxiliary layer 306 and the pad 104. Similarly, the wire lines 308 passing through the gaps of the auxiliary layer 306 is pulled outside of the pad region 109. In addition, the dielectric layer 310 disposed between the auxiliary layer 306 and the pad 104 covers the auxiliary layer 306 and the wire lines 308. Moreover, in the present embodiment, the pattern of the auxiliary layer 306 may be one or any combination of the three shapes mentioned above or any other desired shape.

In another embodiment, the interconnection structure of the present invention may be a structure comprising three, four, or more patterned conductive layers, and the pattern of the auxiliary layer in each patterned conductive layer may be any one of the three shapes mentioned above, respectively. In addition, the dielectric layer is used to isolate the conductive layers, and the via plug is used to connect the auxiliary layers in each patterned conductive layer. Accordingly, the auxiliary layer is regarded as a part of the pad, such that the adherence is increased.

Moreover, in certain embodiments of the present invention, the conventional metal interconnection structure may be disposed above the semiconductor circuit, and other layers below the pad are the same as the ones mentioned above.

Figure 4:
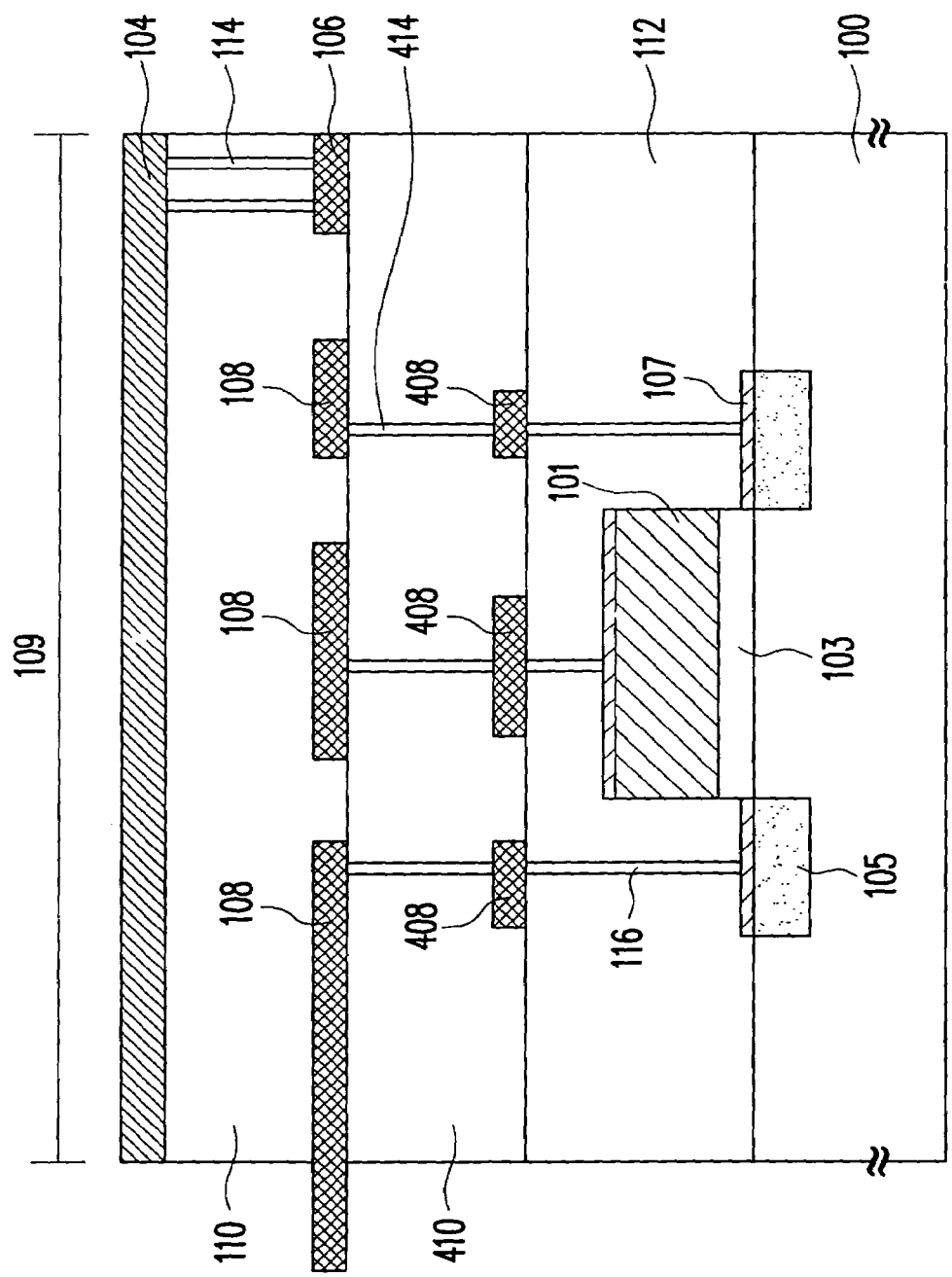
FIG. 4 schematically shows a cross-sectional view of an interconnection structure according to yet another embodiment of the present invention.

FIG. 4 schematically shows a cross-sectional view of an interconnection structure according to yet another embodiment of the present invention. Referring to FIG. 4, in the present embodiment, the contact plug 116 connects the wire lines 408 and the source/drain region 105, and the via plug 414 in the dielectric layer 410 electrically connects the wire lines 108 and 408.

In summary, in the interconnection structure of the present invention, the pad and the auxiliary layer and all auxiliary layers are interconnected by the metal via plugs, and the pattern of each auxiliary layer can be individually fabricated based on the requirement for increasing the adherence and further serving as a part of the pad, so as to prevent from being pulled apart due to insufficient adherence.

Furthermore, the auxiliary layer in the patterned conductive layer has gaps for circuit wiring, such that the semiconductor circuit can be disposed below the pad. In addition, the wire lines passing through the gaps can be pulled outside of the pad region for electrically coupling to other semiconductor element, such that the chip size is effectively reduced.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An interconnection structure, used in a pad region of a substrate, wherein a semiconductor circuit and a pad corresponding to the pad region are disposed on the pad region of the substrate; the interconnection structure comprising:
   a patterned conductive layer disposed below the pad, and the patterned conductive layer comprising:
      an auxiliary layer having a plurality of gaps; and
      a plurality of first wire lines, disposed between the gaps of the auxiliary layer, passing through the gaps and exiting from the pad region;
   a first dielectric layer, disposed between the patterned conductive layer and the pad, covering the patterned conductive layer;
   a plurality of via plugs, disposed in the first dielectric layer, for connecting the auxiliary layer and the pad;
   a second dielectric layer, disposed between the substrate and the patterned conductive layer, covering the semiconductor circuit; and
   a plurality of contact plugs, disposed in the second dielectric layer, for electrically coupling the semiconductor circuit and the first wire lines.

2. The interconnection structure of claim 1, wherein the auxiliary layer comprises a ring conductive layer disposed at the periphery of the corresponding pad region.

3. The interconnection structure of claim 2, wherein the auxiliary layer further comprises a plurality of block conductive layers disposed in the inner side of the ring conductive layer.

4. The interconnection structure of claim 1, wherein the auxiliary layer is a layered conductive layer, and the first wire lines are disposed between the layered conductive layers.

5. The interconnection structure of claim 1, wherein a material of the auxiliary layer and the first wire lines comprises metal.

6. The interconnection structure of claim 5, wherein a material of the auxiliary layer and the first wire lines comprises Al or Cu.

7. The interconnection structure of claim 1, wherein a material of the pad comprises metal.

8. The interconnection structure of claim 1, wherein a material of the contact plugs and the via plugs comprises metal.

9. The interconnection structure of claim 1, wherein a material of the first dielectric layer and the second dielectric layer comprises silicon oxide.

10. The interconnection structure of claim 1, wherein the semiconductor circuit comprises an electrostatic discharge (ESD) protection circuit.

11. The interconnection structure of claim 1, further comprising a plurality of second wire lines disposed below the patterned conductive layer.

12. An interconnection structure used in a pad region of a substrate, wherein a semiconductor circuit and a pad corresponding to the pad region are disposed on the pad region of the substrate; the interconnection structure comprising:
   a plurality of patterned conductive layers disposed below the pad, and each of the patterned conductive layers comprising:
      an auxiliary layer having a plurality of gaps; and
      a plurality of first wire lines, disposed between the gaps of the auxiliary layer, passing through the gaps and exiting from the pad region;
   a plurality of first dielectric layers, disposed between the patterned conductive layers and between the top patterned conductive layer and the pad, covering the patterned conductive layers;
   a plurality of via plugs, disposed in the first dielectric layers, for connecting the auxiliary layers and connecting the auxiliary layer of the top patterned conductive layer and the pad;
   a second dielectric layer, disposed between the substrate and the bottom patterned conductive layer, covering the semiconductor circuit; and
   a plurality of contact plugs, disposed in the second dielectric layer, for electrically connecting the semiconductor circuit and the first wire lines of the bottom patterned conductive layer.

13. The interconnection structure of claim 12, wherein each of the auxiliary layers comprises a ring conductive layer disposed at the periphery of the corresponding pad region.

14. The interconnection structure of claim 13, wherein each of the auxiliary layers further comprises a plurality of block conductive layers disposed in the inner side of the ring conductive layer.

15. The interconnection structure of claim 12, wherein each of the auxiliary layers is a layered conductive layer, and the first wire lines are disposed between the layered conductive layers.

16. The interconnection structure of claim 12, wherein a material of the auxiliary layers and the first wire lines comprises metal.

17. The interconnection structure of claim 16, wherein a material of the auxiliary layers and the first wire lines comprises Al or Cu.

18. The interconnection structure of claim 12, wherein a material of the pad comprises metal.

19. The interconnection structure of claim 12, wherein a material of the contact plugs and the via plugs comprises metal.

20. The interconnection structure of claim 12, wherein a material of the first dielectric layer and the second dielectric layer comprises silicon oxide.

21. The interconnection structure of claim 12, wherein the semiconductor circuit comprises an electrostatic discharge (ESD) protection circuit.

22. The interconnection structure of claim 12, further comprising a plurality of second wire lines under the bottom patterned conductive layer.

* * * * *